(12) United States Patent
Goel

(10) Patent No.: US 8,436,639 B2
(45) Date of Patent: May 7, 2013

(54) CIRCUITS AND METHODS FOR TESTING THROUGH-SILICON VIAS

(75) Inventor: Sandeep Kumar Goel, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/053,333

(22) Filed: Mar. 22, 2011

(65) Prior Publication Data

US 2012/0242367 A1 Sep. 27, 2012

(51) Int. Cl.
- *H03K 19/003* (2006.01)
- *H03K 19/173* (2006.01)
- *G01R 31/02* (2006.01)

(52) U.S. Cl.
USPC .................. 326/16; 326/46; 324/762.03

(58) Field of Classification Search .................. 326/9–16
See application file for complete search history.

(56) References Cited

U.S. PATENT DOCUMENTS

| | | | | |
|---|---|---|---|---|
| 2010/0060310 A1* | 3/2010 | Laisne et al. | | 326/10 |
| 2011/0080184 A1* | 4/2011 | Wu et al. | | 324/750.3 |
| 2011/0080185 A1* | 4/2011 | Wu et al. | | 324/750.3 |
| 2011/0102006 A1* | 5/2011 | Choi et al. | | 324/750.3 |
| 2012/0038388 A1* | 2/2012 | Tseng et al. | | 326/52 |

OTHER PUBLICATIONS

"IEEE Standard Test Access Port and Boundary-Scan Architecture", IEEE Std. 1149.1™-2001 (R2008), (Revision of IEEE Std 1149.1-1990), The Institute of Electrical and Electronics Engineers, Inc., 2001, New York, NY, 208 pages.
"Design for Test", from Wikipedia, 2011, 4 pages.

* cited by examiner

*Primary Examiner* — Jany Tran
(74) *Attorney, Agent, or Firm* — Duane Morris LLP

(57) ABSTRACT

A multiple level integrated circuit uses an array of oppositely oriented individually enabled buffers between through-silicon vias (TSVs) and a clocked flip-flop, for each of multiple signal lines that include TSVs. Applying and/or reading logic levels to and from the TSVs and associated flip-flops produces values that a logic element compares to expected values characterizing nominal operation or detects open and short circuit defects. A process associated with testing the TSVs during assembly comprises testing for short circuits and then exposing and connecting the TSVs via a conductive layer to check for open circuits.

21 Claims, 6 Drawing Sheets

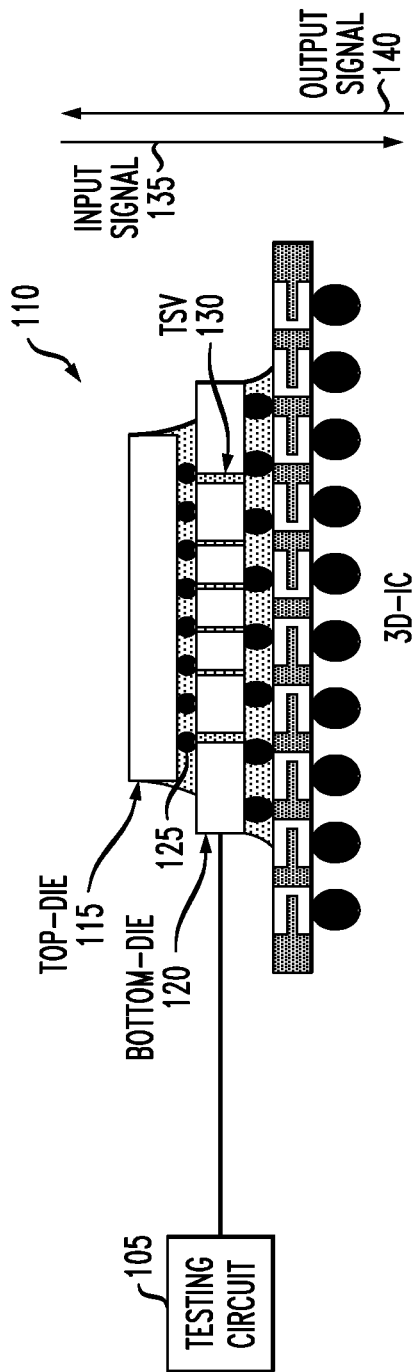

FIG. 5
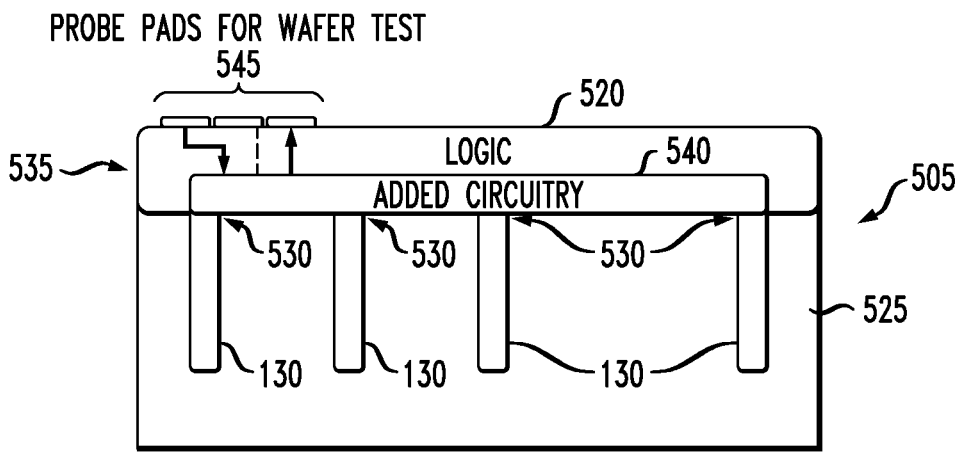
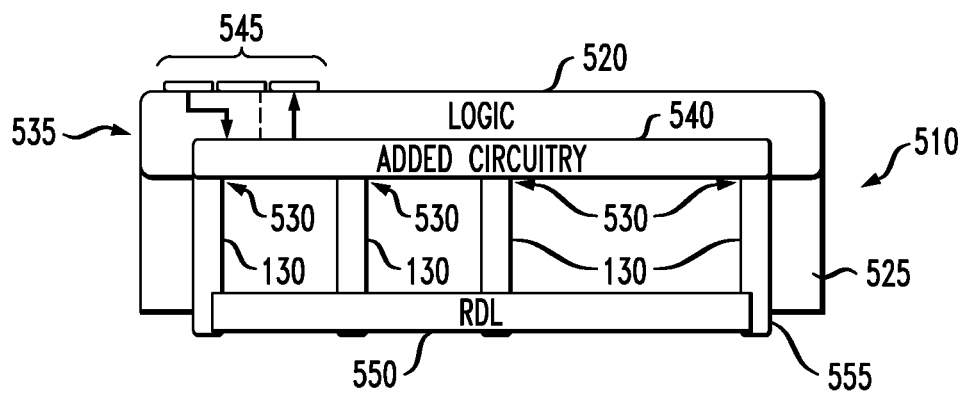
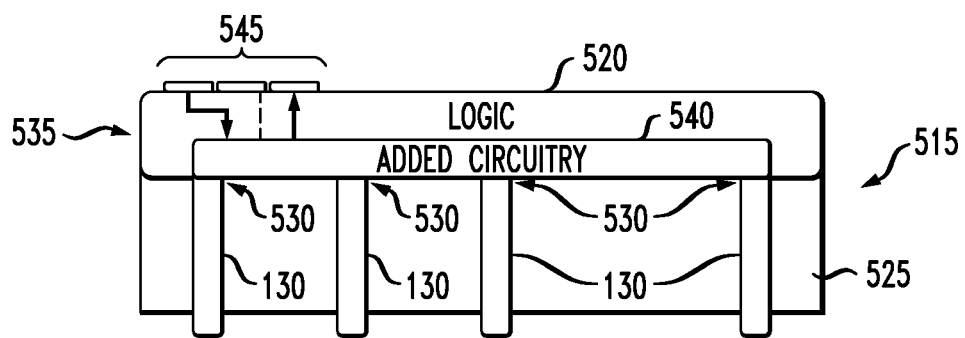

CIRCUITS AND METHODS FOR TESTING THROUGH-SILICON VIAS

BACKGROUND

Stacked multi-level or "3D" integrated circuits offer several advantages over conventional 2D integrated circuits, such as lower power consumption, faster performance, reduced physical area consumption and package size. Typically, a 3D integrated circuit includes through-silicon vias (TSVs) that facilitate transferring data from one die to another die stacked against the first. Thus, testing of TSVs for electrical integrity should be done before and after stacking the dies to ensure the proper functionality and high manufacturing quality of the 3D integrated circuit.

Desirable in the art is an improved circuit and method for testing through-silicon vias (TSVs) that would improve upon the conventional circuit and method as to these and other aspects.

BRIEF DESCRIPTION OF THE DRAWINGS

The accompanying drawings illustrate preferred embodiments of the invention, as well as other information pertinent to the disclosure, in which:

FIG. 1 is a block diagram that illustrates an embodiment of a system having a testing circuit configured to detect defects of through-silicon vias (TSVs);

FIG. 5 show diagrams of 3D integrated circuits that are used to illustrate pre-bond testing methods in accordance with an embodiment of the present disclosure.

DETAILED DESCRIPTION

Figure 3:
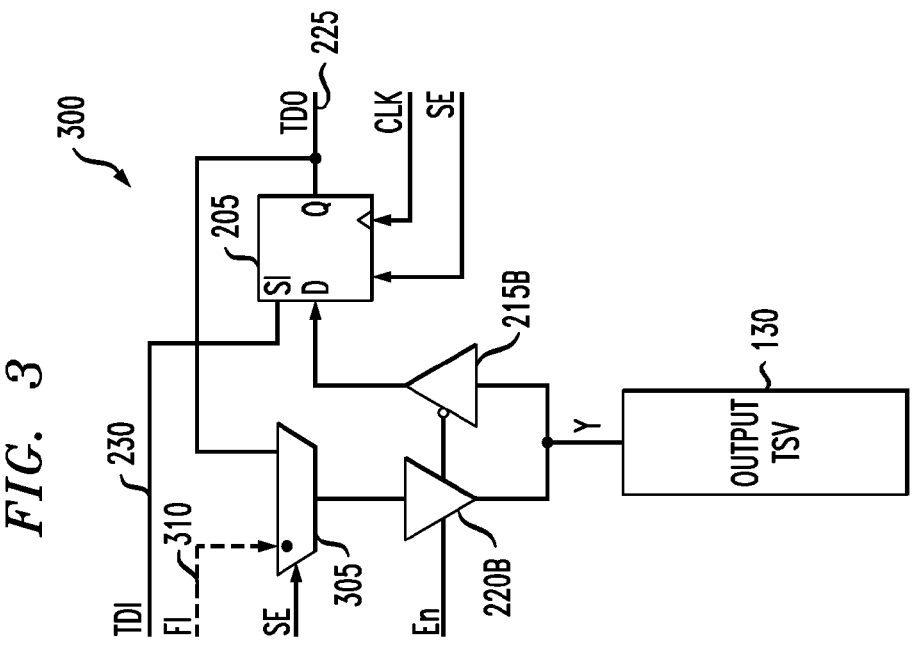
FIG. 3 is a block diagram that illustrates another embodiment of a testing circuit, such as that shown in FIG. 1.

Systems having aspects and objects disclosed herein are discussed with reference to figures demonstrating examples of such systems. Although the exemplary systems are described in detail, they are provided for purposes of illustration only and various modifications are feasible within the scope of this disclosure. In addition to the exemplary systems that are described, examples of methods for testing through-silicon vias (TSVs) are provided to explain the manner in which testing circuits can be used advantageously to detect defects of the TSVs.

FIG. 1 is a block diagram that illustrates an embodiment of a system having a testing circuit 105 configured to detect defects of TSVs 130. In this example, the testing circuit 105 is electrically connected to a 3D integrated circuit 110 having the TSVs 130. The 3D integrated circuit 110 includes a top die 115 and a bottom die 120 coupled together via an electrical coupling 125 and the TSVs 130. Signals that for purposes of illustration can be deemed input signals 135 are applied to the top die 115 and pass through to the bottom die 120, and vice versa with respect to deemed output signals 140. Which of the oppositely passing signals are to be deemed inputs and which are to be deemed outputs is simply a matter of perspective; however the distinction of input versus output is made in this disclosure for ease of explanation when distinguishing between the opposite signals. The testing circuit 105 is further described in connection with FIGS. 2-7.

Figure 2:
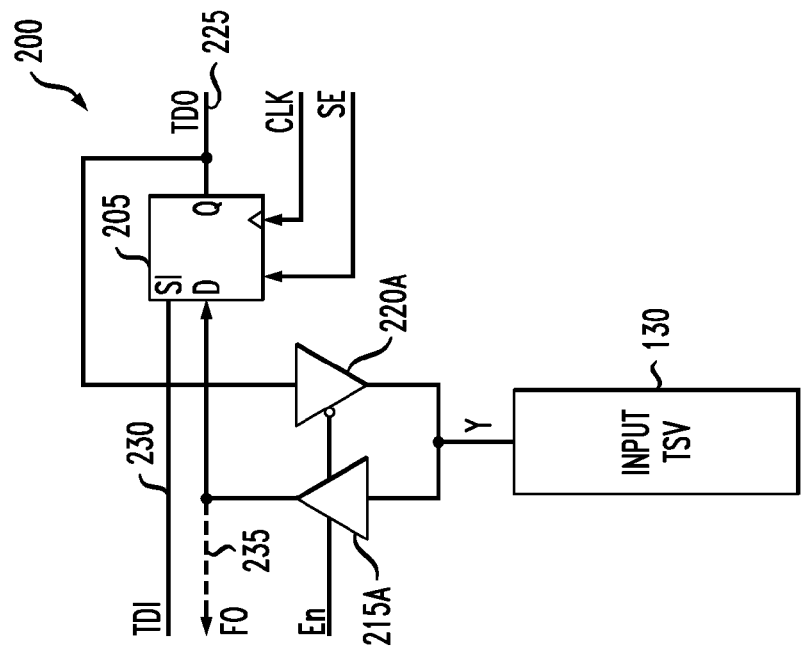
FIG. 2 is a block diagram that illustrates an embodiment of a testing circuit, such as that shown in FIG. 1.

FIG. 2 is a block diagram that illustrates an embodiment of a testing circuit 200, such as that shown in FIG. 1. The testing circuit 200 can be used to detect for defects of the TSV 130 by applying input signals 230 to the 3D integrated circuit 110. The testing circuit 200 includes a first buffer 220A and second buffer 215A, each having a respective input and output coupled as shown to the input and output of a storage element 205 (latch or similar flip-flop device).

The output of the first buffer 220A is designed to be electrically coupled to the TSV 130 and to the input of the second buffer 215A. The two buffers 220A and 215A can be enabled only one at a time, according to the state of an enable signal En. In a launch scenario, the flip-flop device 205 stores one bit of information and has an output Q that is electrically coupled to the input of the first buffer 220A and also to output signal path 225. Alternatively or additionally, in a launch last-shift scenario the value stored in the flip-flop device 205 can be applied to the TSV 130 via the first buffer 220A, when enabled due to a negative (e.g., low-true) state of the enable signal En. The flip-flop device 205 shifts the value stored in the flip-flop device 205 and inputs the shifted value into the TSV 130 via the first buffer 220.

The output of the second buffer 215A is coupled to an output 235 and to the input D of the flip-flop 205. It should be noted that the output 235 can be coupled to a functional logic 405 (FIG. 4) of the 3D integrated circuit 110 that receives the signals from the output of the second buffer 215A. The input of second buffer 215A is coupled to the TSV 130 and the output of first buffer 220A. Buffer 215A is enabled by a high-true state of the enable signal En (namely the opposite state from the state that enables buffer 220A. In a functional/capture scenario, the value represented by the level at TSV 130 can be inputted into the flip-flop device 205 via the second buffer 215A.

According to the foregoing scenarios, the value at TSV 130 is either applied to the input of flip-flop 205 or the value at the output of flip-flop 205 is applied to TSV 130, depending on the state of the enable signal En. The value at the input to the flip-flop 205 is loaded or shifted to the output of flip-flop 205 upon the occurrence of a clock edge. In a silent shift scenario, the flip-flop device 205 shifts in the value stored in the flip-flop device 205 without inputting the value from the flip-flop device 205 into the TSV 130 via the first buffer 220 nor inputting the value from the TSV 130 into the flip-flop device 205 via the second buffer 215A. It should be noted that multiple TSVs 130 can coupled with multiple respective first and second buffers 220A, 215A which are coupled to multiple respective flip-flop devices 205.

The first and second buffers 220A, 215A can be switched on and off via the En enable signal. For example, if En signal is "0", the first buffer 220A is switched on and the second buffer 215A is switched off during the operation of inputting the value from the flip-flop device 205 into the TSV 130 via the first buffer 220A. Additionally or alternatively, if En signal is "1", the second buffer 215A is switched on and the first buffer 220A is switched off during the operation of inputting the value from the TSV 130 into the flip-flop device 205 via the second buffer 215A. The storage element is a scannable flip flop. SI stands for scan-input, D stands for functional input, SE stands for scan_enable. When SE=0, the flip flop is in normal functional mode and Q is driven by D. When SE=1, flip flop is in the shift mode and Q is driven by SI.

FIG. 3 is a block diagram that illustrates another embodiment of a testing circuit 300, with aspects in addition to those shown in FIG. 1. In this example, the architecture of the testing circuit 300 of FIG. 3 is similar to the architecture of the testing circuit 200 as described in FIG. 2. Like features are labeled with the same reference numbers, such as the first and second buffers 220B, 215B (which in this figure are exchanged left-for-right compared to FIG. 2) and the flip-flop device 205. Further, the testing circuit 300 can be used to detect for defects of the TSV 130 by applying output signals 225 to the TSV 130 via multiplexer 305 and buffer 220B or capturing the value at TSV 130 in the storage element 205 via buffer 215B. The multiplexer 305 includes an input and an output. The input of the multiplexer 305 is coupled to the output 225 of the flip-flop device 205 and a functional input signal 310. The output of the multiplexer 305 is electrically coupled to the input of the first buffer 220B. In the functional operation mode, a value from the functional input signal 310 can be inputted into the TSV 130 via the multiplexer 305 and the first buffer 220B. It should be noted that the functional input signal 310 can be generated by the functional logic 405 (FIG. 4) of the 3D integrated circuit 110.

By using the various enabled and/or disabled connections and by employing the flip-flop 205 as a register to store the level applied to input D or SI at the time of a clock edge, binary logic values can be applied to the TSV 130 or read from the TSV 130. This enables the operation of the TSV 130 and circuits coupled thereto to be tested for various conditions including open circuits, shorts, coupling of signal lines or coupling of signal lines to power supply levels, etc. By controlling the circuit including the enable/disable signals, clock timing and logic values associated with the flip-flop device 205, a 1149.1 test access port (TAP) 410 (shown in FIG. 4) having a controller (not shown) can be operated to read or apply levels and to monitor for expected nominal operation. Where the operation is found to be nominal and as expected, or to vary from nominal, the 1149.1 TAP 410 thereby can determine whether the TSV 130 is operating correctly and can detect and localize problems such as electrical shorts and electrical opens.

Figure 4:
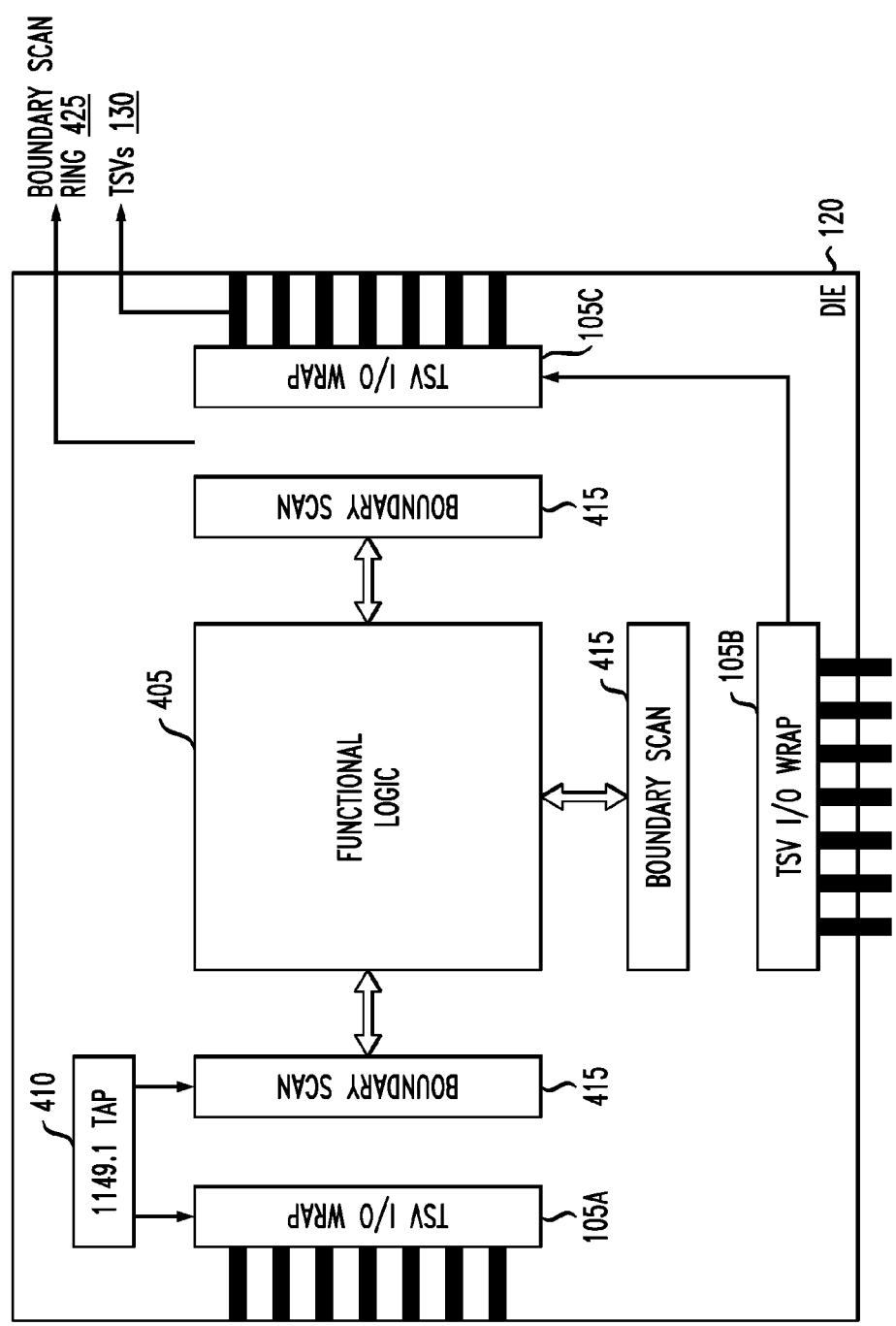
FIG. 4 is a top-level architecture diagram that illustrates an embodiment of a testing circuit that is electrically coupled to a 3D integrated circuit, such as that shown in FIG. 1.

FIG. 4 is a top-level architecture diagram that illustrates an embodiment of a testing circuit 400 that is electrically coupled to a 3D integrated circuit 110, such as that shown in FIG. 1. Multiple TSVs 130 that are embedded into a die 120 are electrically coupled to multiple TSV input/output (I/O) wraps 105A-C. The TSV input/output (I/O) wraps 105A-C are electrically coupled to multiple boundary scan sections 415 via boundary scan rings 425. The boundary scan sections 415 are electrically coupled to the 1149.1 test access port (TAP) 410 and a functional logic 405. As mentioned above the 11.49.1 TAP 410 can include a controller that can control the testing procedure to detect short or open defects of the TSVs 130. By observing the values at TDO 225 (FIGS. 2 and 3) and comparing the values at TDO 225 with expected value, the 1149.1 TAP 410 can determine if the TSV(s) 130 is working correctly or not. The TSV input/output (I/O) wraps 105A-C can include testing circuits 200, 300 and can cooperate with the 1149.1 TAP 410 to test the TSVs 130 for defects.

The functional logic 405 is the normal die logic that is a core function of the die. The TSVs 130 are connected to its inputs and outputs. The functional logic 405 can send and receive signals to the TSVs 130 as part of the operation and functionality of integrated circuit 110 via the boundary scans 415, boundary scan rings 425, and TSV I/O wraps 420. Additionally or alternatively, the boundary scan sections 415 can include a flip-flop device 205 (FIG. 2), for example one per coupled signal line or bit position.

FIG. 5 show diagrams of 3D integrated circuits 505, 510, 515 that are used to illustrate pre-bond testing methods in accordance with an embodiment of the present disclosure. The 3D integrated circuit 505 includes TSVs 130 that are embedded in a substrate 525. One end 530 of each TSV 130 is located adjacent to the bottom portion 535 of the substrate 525 and is coupled to the circuits therein. The bottom portion 535 can include a logic layer 520 and added circuitry 540 that electrically couples the TSVs 130 to probe pads 545. To test for electrical shorts between the TSVs 130, multiple first and second buffers 220, 215 (such as described above) can be electrically coupled to the ends 530 of the TSVs 130 via probe pads 545.

In the upper part of FIG. 5, the TSVs 130 terminate within the substrate 525. Additionally or alternatively, and as shown in the middle and lower parts of FIG. 5, pre-bond testing can be implemented on the 3D integrated circuit 510 where a portion of the substrate 525 is removed such that an end 555 of each TSV 130, opposite from end 530, is exposed at the surface or protrudes out of the substrate 525. Defects are not necessarily linked to removal of substrate; even during manufacturing of TSVs shorts can happen, therefore it is best not to mention the cause of shorts. In order to test for electrical shorts, multiple first and second buffers 220, 215 can be electrically coupled to the exposed proximal ends 555 of each TSV 130 via the probe pads 545 and the added circuitry 540. Additionally or alternatively and as shown in the middle part of FIG. 5, a layer 550 can be added to the substrate 525 at the exposed proximal end 555 of the TSV 130. The layer 550 deliberately electrically connects the TSVs 130 together. To test for electrical opens, the multiple first and second buffers 220, 215 are electrically coupled to the exposed proximal ends 555 of the TSVs 130. The layer 550 can include an active (conductive) glue, a metal layer, a read distribution layer, or a combination thereof.

Additionally or alternatively, the pre-bond testing can be implemented on the 3D integrated circuit 515 where the added layer 550 is removed from the substrate 525, shown at the bottom part of FIG. 5. To test for electrical shorts between the TSVs 130 that can be caused by the added layer 550, the first and second buffers 220, 215 are electrically coupled to the exposed proximal ends 555 of the TSVs 130. The pre-bond testing methods can further be described in connection with FIGS. 6 and 7.

Figure 6:
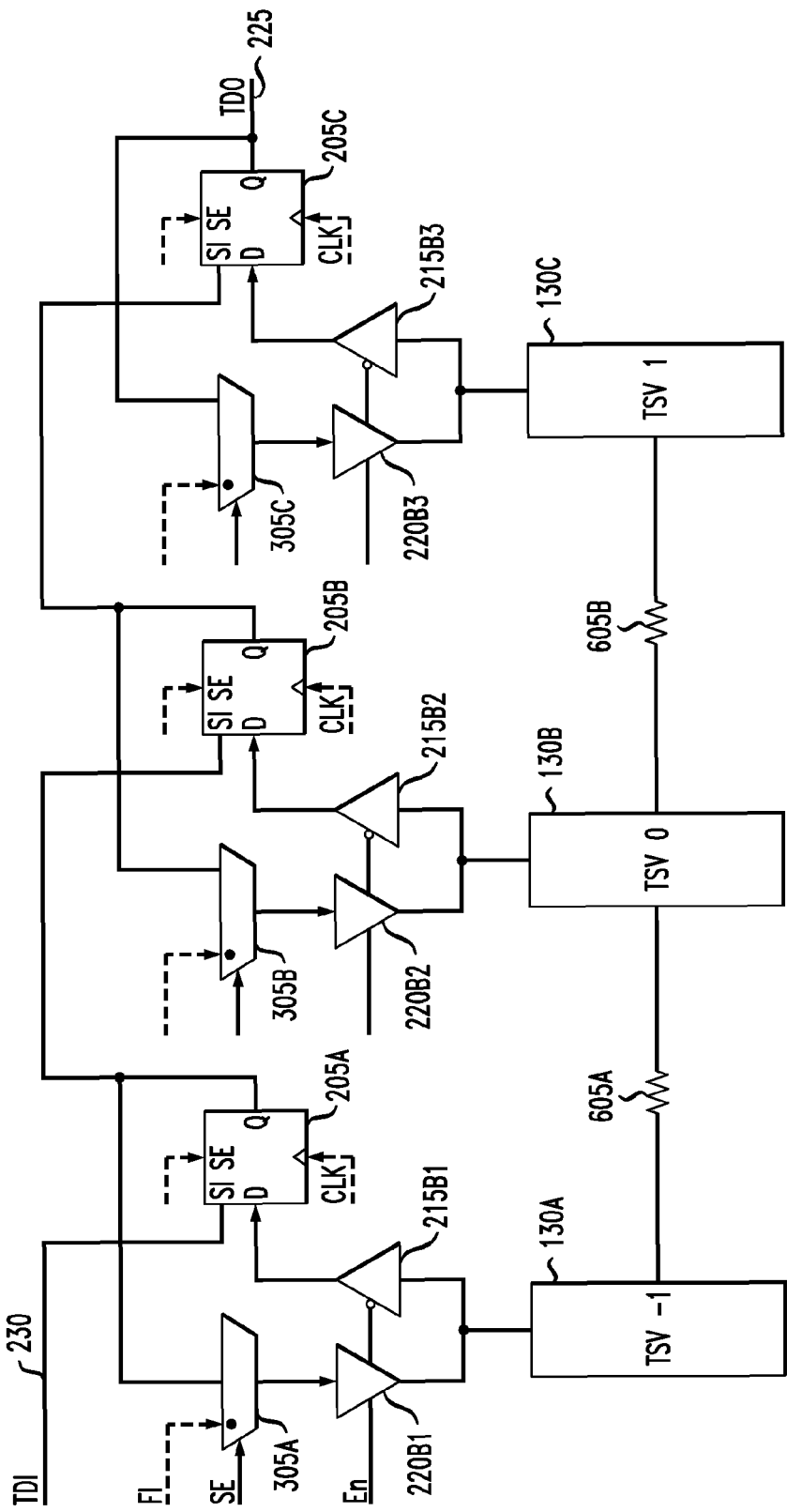
FIGS. 6 and 7 are schematic diagrams that illustrate a testing circuit for checking the electrical integrity of TSVs in accordance with an embodiment of the present disclosure.
Figure 7:
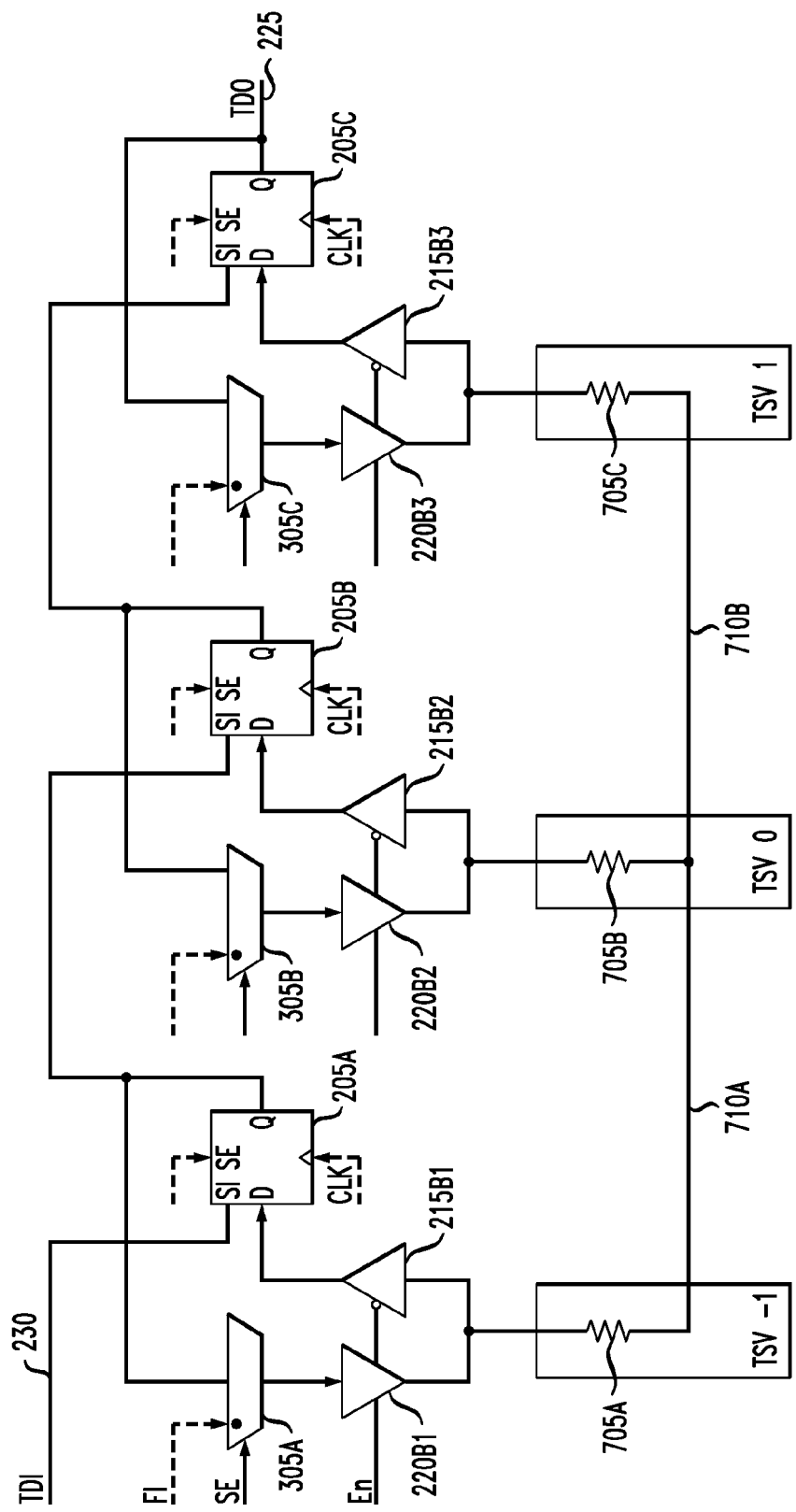

FIGS. 6 and 7 are schematic diagrams that illustrate a configuration of testing circuit 105 for checking the electrical integrity of TSVs 130 in accordance with an embodiment of the present disclosure. In the examples, the testing circuit 105 includes three sets of first and second buffers 220B1-B3, 215B1-B3, multiplexers 305A-C, and flip-flop devices 205A-C arranged along distinct TSV lines including a given line TSV0 and adjacent lines TSV1 and TSV-1. Although it would be possible to arrange any configuration of lines in a coupled arrangement as shown, defects such as shorts are likely to involve lines in proximity and defects such as opens may extend over two or more adjacent lines. The testing circuit 105 in FIG. 6 can be electrically coupled to TSVs 130A-C. In FIG. 6, resistors 605A, B are shown to model the defect (resistance) between the TSVs 130A-C for detecting shorts or low resistance paths between the TSVs 130A-C. Accordingly, the resistors 605A, B are not physically connected between the TSVs 130A-C but are shown figuratively. A slow signal test can detect hard shorts between the TSVs 130A-C.

In FIG. 7, resistors 705A-C are shown to model the serial resistance of the TSVs 130A-C for detecting resistive opens on the TSVs 130A-C. The slow signal test can detect hard opens between the TSVs 130A-C. Accordingly, the resistors 705A-C and electrical connections 710A, B are not physically part of or connected between the TSVs 130A-C, respectively, but are shown figuratively.

In testing for both electrical shorts and opens shown in FIGS. 6 and 7, the testing circuit 105 can apply binary logic values can be shifted in the flip flop devices 205A-C. The stored values in the flip-flop devices 205A-C are then applied to TSVs 130A-C. Next, the logic values present at the TSVs 130A-C are captured back in storage elements 205A-C. The captured values are then shifted out of the storage elements via TDO 225 and compared with the expected values. Based on the difference between expected and observed values, possible electrical shorts or opens in the associated TSVs are identified.

For example, responsive to receiving the test result values from the flip-flop devices 205A-C and the test result values having the values of all zeros (e.g., 000) or all ones (e.g., 111) (or alternating values or other predetermined combinations of zeros and ones), the 1149.1 TAP 410 can determine that whether electrical shorts or opens exist between the TSVs 130A-C based on correspondence of the applied input values (e.g., 001, 100, 110, 011, 111) to the test result values. Additionally or alternatively, responsive to receiving the test result values (e.g., 101, 011, 110) that have the same values as the applied binary values (e.g., 101, 011, 110) from the flip-flop device 205A-C, the 1149.1 TAP 410 can determine whether electrical opens or shorts exist between the TSVs 130A-C.

As described herein, an improved circuit and method for detecting defects related to the TSVs 130, such as electrical shorts and opens, are presented utilizing the testing circuits 200, 300, 400 and testing methods in FIG. 5 This approach allows for an accurate testing and diagnosis for defects of the TSV 130. Testing for both electrical shorts and opens can be achieved as well as testing for hard and resistive shorts/opens. The testing circuits 200, 300, 400 can be controlled by an existing the 1149.1 TAP 410 and does not include additional chip pins.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An integrated circuit comprising:
at least one first buffer having an input and output, wherein at least one of the input and output of the first buffer is electrically coupleable to respective multiple through-silicon vias (TSVs) to carry a signal in at least one of two opposite directions to and from the TSV;
at least one flip-flop device that stores at least one bit of information, wherein at least one of an input and an output of the flip-flop device is electrically coupled to said at least one first buffer in a configuration wherein a value can be stored in the flip-flop from the respective TSV or applied to the respective TSV from the at least one flip-flop, via the respective first buffer;
at least one second buffer having an input and output, wherein the inputs and outputs of the first and second buffers are electrically coupled to one of multiple TSVs and an input of the at least one flip-flop device, respectively, for carrying signals in opposite directions between the flip-flop device and said one of the TSVs, wherein a value is readable from said one of the TSVs to the flip-flop device and readable from the flip-flop device to said one of the TSVs by operation of the first and second buffers to carry signals in opposite directions.

2. The integrated circuit of claim 1, wherein the first buffers are switched on and the second buffers are switched off during the operation of inputting the value from the at least one flip-flop device into the multiple TSVs via the multiple first buffers, wherein the multiple second buffers are switched on and the multiple first buffers are switched off during the operation of inputting the value from the multiple TSVs into the at least one flip-flop device via the multiple second buffers.

3. The integrated circuit of claim 1, comprising one said first buffer, one said second buffer and one said flip-flop device for each of a plurality of TSVs subject to test, and further comprising at least one multiplexer having an input and an output, wherein the input of the at least one multiplexer is electrically coupled to the output of the at least one flip-flop device and a functional signal, wherein the output of the at least one multiplexer is electrically coupled to the input of the multiple first buffers, wherein a value from the functional sign is inputted into the multiple TSVs via the at least one multiplexer and the multiple first buffers.

4. The integrated circuit of claim 3, wherein the at least one flip-flop device shifts the value stored in the at least one flip-flop device and inputs the shifted value into the multiple TSVs via the at least one multiplexer and the multiple first buffers.

5. The integrated circuit of claim 1, wherein binary values are applied to and from said multiple TSVs and logic values are inputted and outputted to and from corresponding multiple flip-flop devices, and wherein said logic values are processed to assess whether the multiple TSVs have electrical shorts and electrical opens as shown by departure of the logic values from nominally expected values.

6. The integrated circuit of claim 1, wherein the multiple TSVs are coupled to at least one boundary scan that is electrically coupled to a standard functional logic element, wherein the at least one boundary scan is electrically coupled to a test access port (TAP), wherein the at least one boundary scan includes the at least one flip-flop device, wherein the at least one boundary scan is electrically coupled to a TSV input/output (I/O) wrap that is designed to connect to the TSVs to test the electrical integrity of the TSVs.

7. The integrated circuit of claim 1, wherein binary values are applied to at least a subset of the multiple TSVs, wherein logic values are outputted from the multiple TSVs based on the binary values and are processed to determine whether electrical shorts and/or electrical opens exist between the multiple TSVs.

8. The integrated circuit of claim 7, wherein the at least one flip-flop device outputs test result values to a functional logic element based on the logic values, wherein responsive to the at least one flip-flop device outputting the test result values of a pattern of logic values, the functional logic determines whether or not at least one electrical short exists between the multiple TSVs.

9. The integrated circuit of claim 7, wherein the at least one flip-flop device outputs test result values to a functional logic element based on the logic values, wherein responsive to the at least one flip-flop device outputting the test result values of the same value as the applied binary values, the functional logic determines whether or not at least one electrical open exists along a conductor including at least one of the TSVs.

10. The integrated circuit of claim 1, wherein the multiple first and second buffers are electrically coupled to the multiple TSVs in one of the following conditions:

a) the multiple TSVs are embedded into a substrate, wherein the distal ends of the multiple TSVs are adjacent to a bottom portion of the substrate, wherein the multiple first and second buffers are electrically coupled to the distal ends of the respective multiple TSVs to test for electrical shorts, b) a portion of the substrate is removed such that the proximal ends of the multiple TSVs are exposed from the substrate, wherein the first and second buffers are electrically coupled to the exposed proximal ends of the multiple TSVs to test for electrical shorts, and c) a layer is added to the substrate which electrically couples the multiple TSVs together, wherein the layer includes an active glue, metal layer, a read distribution layer, or a combination thereof, wherein the first and second buffers are electrically coupled to the exposed proximal end of the multiple TSVs to test for electrical opens, and d) the added layer is removed from the substrate, wherein the first and second buffers are electrically coupled to the exposed proximal ends of the multiple TSVs to test for electrical shorts that are related to the removed layer.

11. The integrated circuit of claim 1, wherein the at least one flip-flop device shifts an input level applied to the flip-flop device into a value stored in the at least one flip-flop device upon occurrence of a clock signal, and applies the value stored in the at least one flip-flop device to a said first buffer that is coupled with one of the multiple TSVs.

12. The integrated circuit of claim 1, wherein the at least one flip-flop device shifts the value stored in the at least one flip-flop device without inputting the value from the at least one flip-flop device into the multiple TSVs via the respective multiple first buffers nor inputting the value from the multiple TSV into the at least one flip-flop device via the respective multiple second buffers.

13. The integrated circuit of claim 1, wherein the first flip-flop device is a clocked flip-flop device.

14. A method for testing for defects of multiple through-silicon-vias (TSVs), comprising:
coupling to each of at least a subset of the multiple TSVs at least one buffer of a plurality of buffers each having an input and an output, said coupling including gating that selectively enables the at least one buffer to operate in one of two opposite directions, for applying at least one bit of information to a respective said TSV and for reading at least one bit of information from the respective said TSV;
applying binary values to respective said TSVs of the multiple TSVs using at least one of the buffers coupled to the at least one TSV and selected for said applying, applying resulting logic values from the multiple TSVs to at least one flip-flop device via multiple buffers, thereby producing an output logic value based on the binary values, the output logic values being coupled to at least one of the buffers selected for said reading; and
determining whether one or more electrical shorts and/or electrical opens exist between the multiple TSVs.

15. The method of claim 14, further comprising, responsive to the at least one flip-flop device outputting test result values of all zeros or all ones based on the logic values, determining that at least one electrical short exists between the multiple TSVs based on the test result values.

16. The method of claim 14, further comprising, responsive to the at least one flip-flop device, outputting test result values that have the same value as the applied binary values, determining that no electrical shorts exist between the multiple TSVs.

17. The method of claim 14, further comprising responsive to the at least one flip-flop device outputting test result values that have the same value as the applied binary values, determining that at least one electrical open exists between the multiple TSVs.

18. The method of claim 14, further comprising responsive to at least one flip-flop device outputting test result values of all zeros or all ones based on the logic values, determining that no electrically opens exist between the multiple TSVs.

19. A method for detecting defects of at least one of multiple through-silicon vias (TSVs) during a process of stacking multiple circuit tiers or levels coupled to one another by the TSVs, comprising:
embedding the multiple TSVs into a substrate, wherein distal ends of the multiple TSVs are adjacent to a bottom portion of the substrate;
removing a portion of the substrate such that the proximal ends of the multiple TSVs are exposed from the substrate, wherein the first and second buffers are electrically coupled to the exposed proximal end of the multiple TSVs;
applying binary values to the distal ends of the respective multiple TSVs to test for electrical shorts;
outputting logic values by the multiple TSVs based on the binary values; and
determining whether one or more electrical shorts exist between the multiple TSVs.

20. The method of claim 19, further comprising
adding a layer to the substrate which electrically couples the multiple TSVs are together, wherein the first and second buffers are electrically coupled to the exposed proximal ends of the multiple TSVs;
applying binary values to the exposed proximal ends of the respective multiple TSVs to test for electrical opens;
outputting logic values by the multiple TSVs based on the binary values; and
determining whether one or more electrical opens exist between the multiple TSVs.

21. The method of claim 20, further comprising:
removing the added layer from the substrate, wherein the first and second buffers are electrically coupled to the exposed proximal ends of the multiple TSVs;
applying binary values to the exposed proximal end of the respective multiple TSVs to test for electrical shorts that are related to the removed layer;
outputting logic values by the multiple TSVs based on the binary values; and
determining whether one or more electrical shorts exist between the multiple TSVs.

* * * * *